United States Patent [19]

Spillman

[11] 4,336,468
[45] Jun. 22, 1982

[54] SIMPLIFIED COMBINATIONAL LOGIC CIRCUITS AND METHOD OF DESIGNING SAME

[75] Inventor: Richard Spillman, Davis, Calif.

[73] Assignee: The Regents of the University of California, Berkeley, Calif.

[21] Appl. No.: 94,450

[22] Filed: Nov. 15, 1979

[51] Int. Cl.³ .................. H03K 19/00; H03K 19/20
[52] U.S. Cl. ................................ 307/440; 307/465
[58] Field of Search ............... 307/440, 445, 463, 465, 307/471

[56] References Cited

U.S. PATENT DOCUMENTS

| | | | |
|---|---|---|---|
| 3,291,974 | 12/1966 | Even | 307/440 |
| 3,381,117 | 4/1968 | Forslund et al. | 307/465 |
| 3,579,119 | 5/1971 | Yau et al. | 307/465 |
| 3,700,868 | 10/1972 | Silvertson, Jr. | 307/465 |

*Primary Examiner*—John Zazworsky
*Attorney, Agent, or Firm*—Phillips, Moore, Lempio & Majestic

[57] ABSTRACT

A logic circuit and method for implementing a given, partially symmetric Boolean function $f(x_1 - x_n)$ which is pairwise symmetric with respect to at least one pair $x_i x_j$ of variables such that the function is invariant under their permutation. The circuit includes a symmetric logic array having a transposition gate for each pair $x_i x_j$, and a combinational logic circuit connected to the output of each transposition gate. The latter filters redundant values of each pair $x_i x_j$ and these values are used in the design of the combinational logic circuit. The invention simplifies or minimizes the gating for performing the function.

8 Claims, 12 Drawing Figures

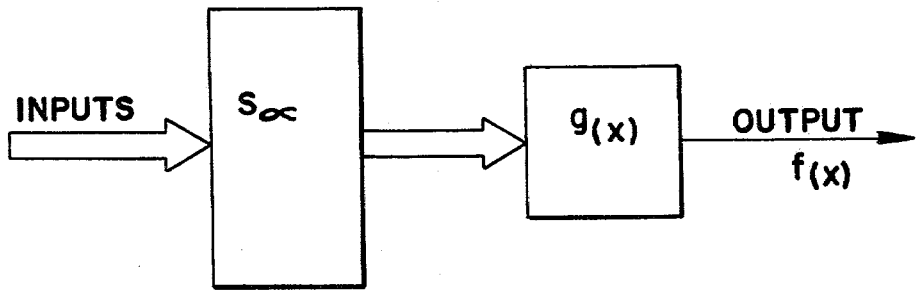
FIG_1    FIG_5
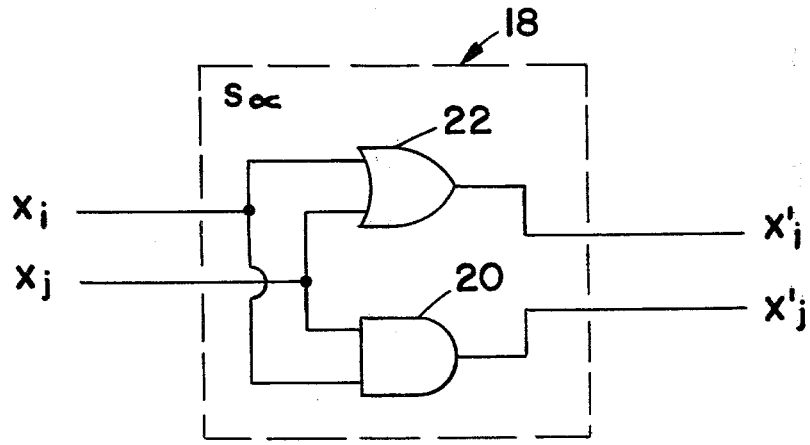
FIG_3
FIG_4

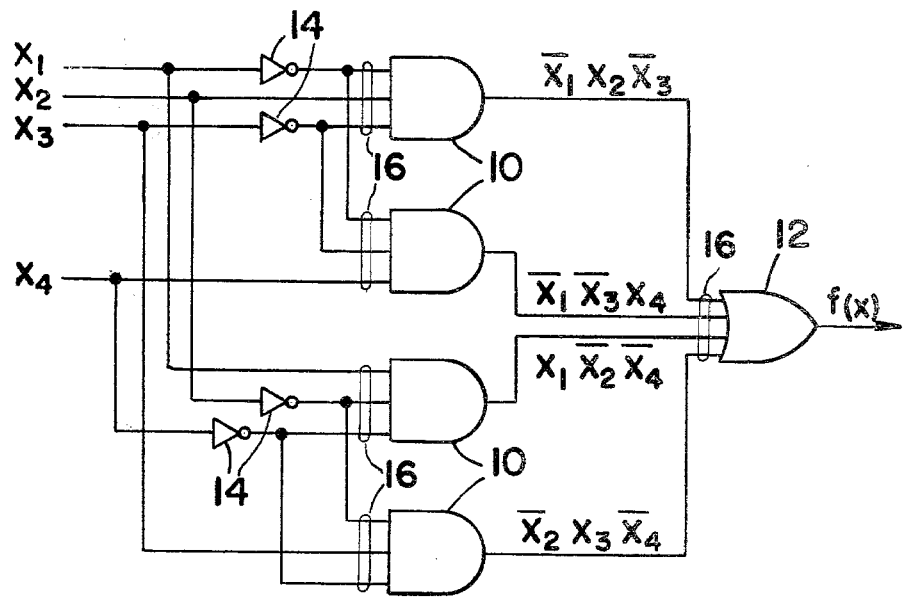
FIG_2 (PRIOR ART)
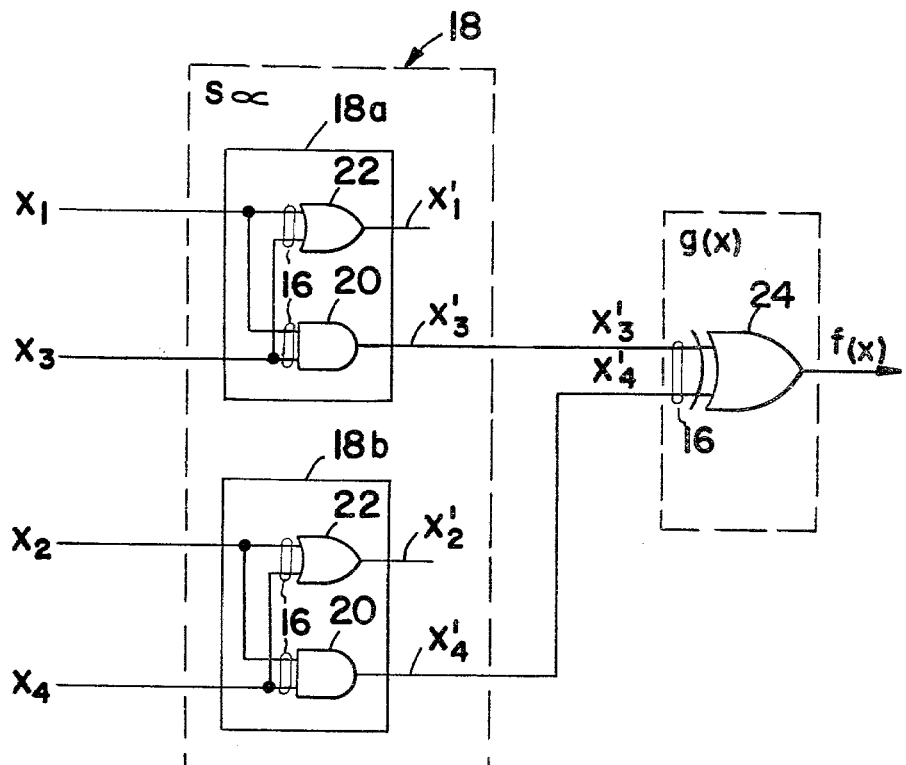
FIG_6

FIG_7A

FIG_7B

FIG_8A

FIG_8B

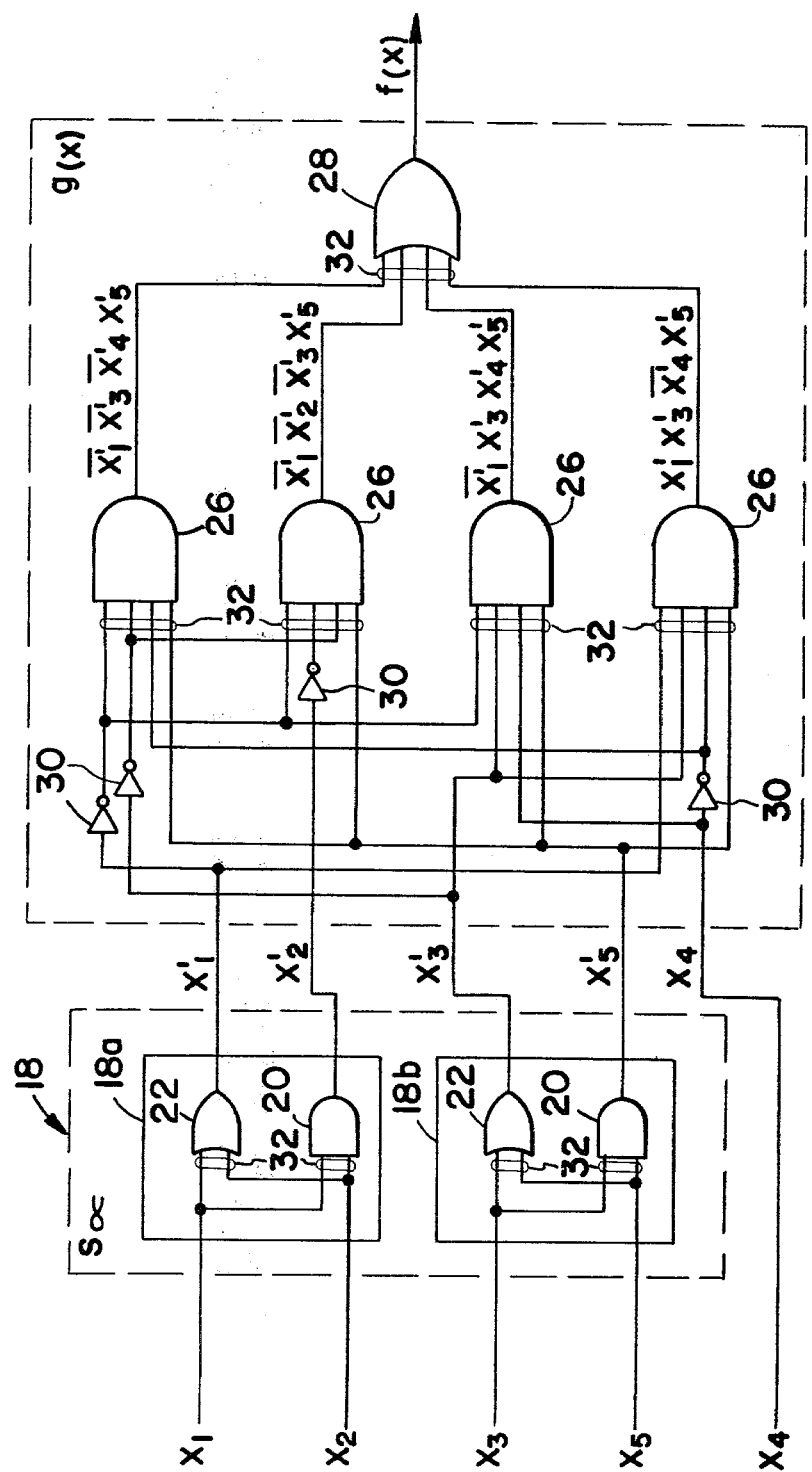
FIG_9

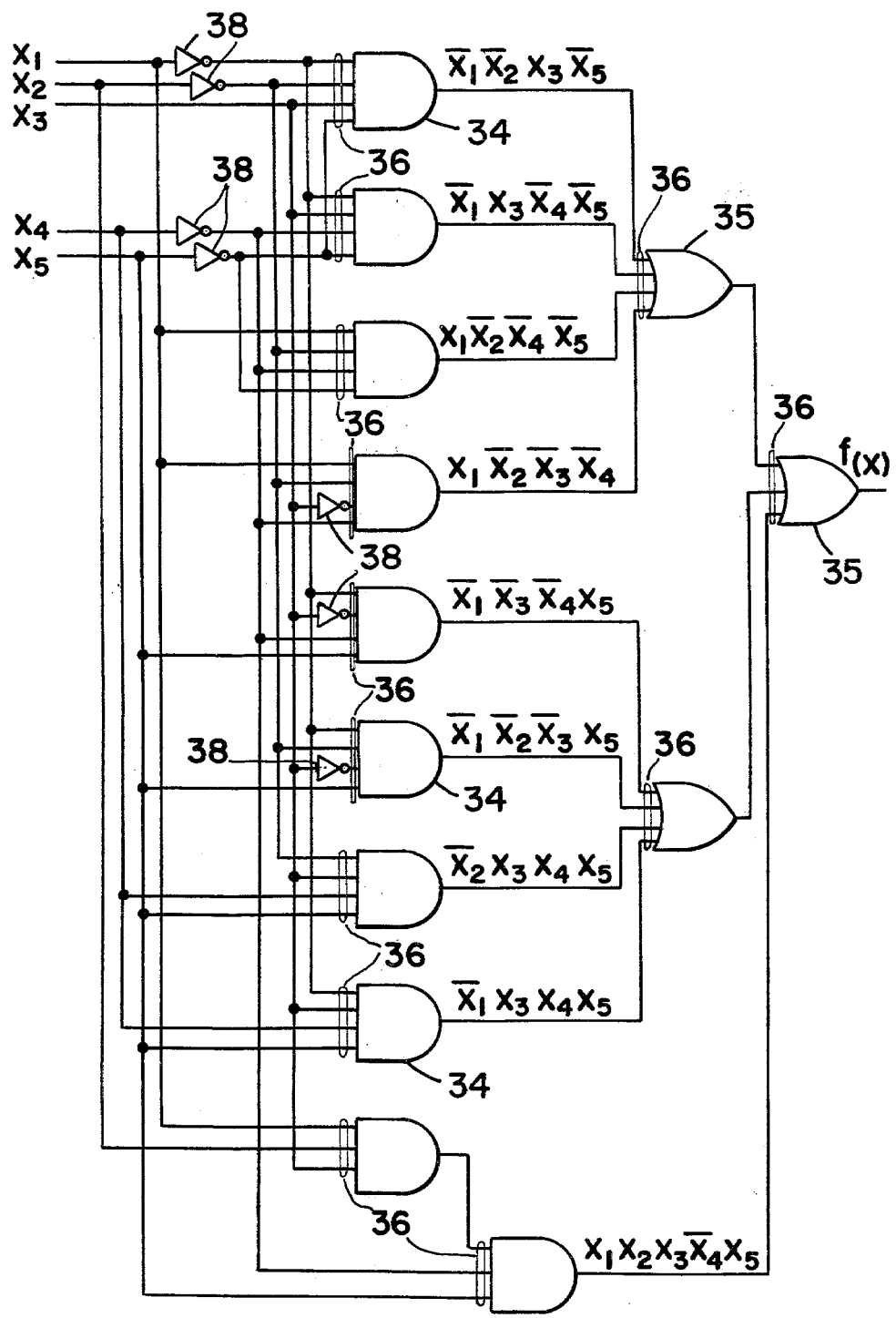
FIG _ 10 (PRIOR ART)

SIMPLIFIED COMBINATIONAL LOGIC CIRCUITS AND METHOD OF DESIGNING SAME

DESCRIPTION

1. Technical Field

This invention relates to logic circuits implementing given Boolean functions and, more particularly, to simplified logic circuits implementing such functions and a method of designing these circuits.

2. Background Art

Boolean algebra is a form of mathematics that is applicable to situations in which "yes" or "no" answers are obtained from a set of conditions, each of which can be either "true" or "false". Thus, Boolean algebra is used extensively in designing switching circuits, such as combinational logic circuits, where the inputs can only be either "on" or "off", and each output can be either "on" or "off". A Boolean mathematical expression is a shorthand notation of both the definition of a problem and its solution, and is used systematically in designing the logic circuits. A very important quality of this mathematical expression is that it provides a means of minimizing the amount of hardware required to perform the switching function of the logic circuits.

Generally, the simplification or minimization of combinational logic circuits involves several well-known steps. First, the requirements for a circuit are set forth as a verbal statement of a problem or from the construction of a truth table. Then, a Boolean function or mathematical expression is developed from these requirements. Next, the Boolean function is simplified using the theorems of Boolean algebra. Then, the simplified function is implemented using a combination of the basic logic gates such as AND, OR and EXCLUSIVE-OR.

As an alternative to simplifying the function using the theorems of Boolean algebra, a graphical device, known as a Karnaugh map, can be used to obtain the simplified Boolean function from the truth table. The Karnaugh map is usually employed to reduce a function having no more than six variables; otherwise, this technique becomes unwieldy. If the function has more than six variables, then computer programs are available to simplify the Boolean function, one example being the well-known Quine-McCluskey algorithm.

Every Boolean function, i.e., every singleoutput function f(x), will fall into one of three classes. These are (1) totally symmetric, (2) totally asymmetric, and (3) partially symmetric. A totally symmetric function f(x) is one which is pairwise symmetric with respect to every pair of input variables, where an input variable can be $x_i$ or $\bar{x}_i$. The function f(x) is pairwise symmetric if it is invariant with respect to variables $x_i$ and $x_j$ under their permutation. That is, if:

$$f(x_1, \ldots, x_i, \ldots, x_j, \ldots, x_n) =$$
$$f(x_1, \ldots, x_j, \ldots, x_i, \ldots, x_n) \quad (1)$$

A simple example of a totally symmetric function is the following:

$$f(x) = x_1 x_2 + x_2 x_1 \quad (2)$$

Equation 2 is a simple, two variable function in which variables $x_1$ and $x_2$ can be interchanged for one another without changing f(x). Equation 2 can be seen to be the simple AND function.

A totally asymmetric function f(x) is one in which no pair of input variables $x_i$ and $x_j$ can be interchanged without changing the function. An example of a totally asymmetric function is the following:

$$f(x) = x_1 x_2 + x_3 x_2 + x_3 \quad (3)$$

Equation 3 contains three variables $x_1$, $x_2$, and $x_3$. The possible pairs of variables are $x_1$ and $x_2$, $x_2$ and $x_3$, and $x_3$ and $x_1$. However, if any interchanges are made, i.e., $x_1$ for $x_2$ and $x_2$ for $x_1$, $x_2$ for $x_3$ and $x_3$ for $x_2$ or $x_3$ for $x_1$ and $x_1$ for $x_3$, the function f(x) will change.

A partially symmetric function f(x) is one having several but not all pairs of variables $x_i x_j$ that can be interchanged without changing the function. An example of such a function is the following:

$$f(x) = x_1 x_2 + x_3 x_2 \quad (4)$$

In the three variable function f(x) of equation 4, a set S having a pair of variables $x_1$ and $x_3$ exists such that these variables can be interchanged, i.e., $x_1$ for $x_3$ and $x_3$ for $x_1$, without changing the function. The other pairs of variables $x_1$ and $x_2$, and $x_2$ and $x_3$, cannot be interchanged without changing the function f(x).

In order to better understand the present invention, a partially symmetric function f(x) will be described below as having the set S of pairs of input variables which can be interchanged without changing the function. Each such pair is an element of the set S. The term $\alpha$ also will be used, where $\alpha$ is a permutation of each element or pair of variables in the set S. Consequently, from the above it follows that:

$$\alpha f(x) = f(x) \quad (5)$$

That is, the function f(x) is not changed by $\alpha$.

The above described techniques for simplifying the Boolean function are considered in designing logic circuits irrespective of the function classification. In other words, these techniques do not exploit the property of the symmetry of the function to simplify the implementation of combinational logic circuits.

Actually, in practice, in designing the combinational logic circuits the above-mentioned techniques are not utilized. Typically, the Boolean function f(x) is implemented without simplifying it. This is because in practice most functions will contain a large number of variables, e.g., 20-30, and the result of simplification will be a reduction of only a relatively few number of gates and inputs. This reduction in number of gates and inputs is not worthwhile in comparison to the time and effort needed to simplify the function.

SUMMARY OF THE INVENTION

It is an object of the present invention to provide a novel logic circuit implementing a given Boolean function.

Another object of the present invention is to take advantage of the property of symmetry of a Boolean function in designing logic circuits.

It is another object of the present invention to provide, for a large number of single output Boolean functions, a substantial reduction in the number of gates and inputs in logic circuits implementing these functions.

A yet further object of the present invention is to provide a logic circuit which has increased reliability over other logic circuits implementing the same Boolean function.

Another object of the present invention is to provide a novel method of implementing a combinational logic circuit defined by a given Boolean function.

These and other objects are obtained through the use of a logic circuit for implementing a given, partially symmetric, Boolean function $f(x_1-x_n)$ having one output and which is symmetric with respect to several variables of the input variables $x_1-x_n$ such that the function is invariant under the permutation of the several variables, comprising symmetric logic means for filtering only redundant values of the several variables, the redundant values being "don't cares", and combinational logic means, connected to said symmetric logic means, for generating the one output and having a construction as a function of the "don't cares".

In the method of the present invention, a given, partially symmetric Boolean function $f(x_1-x_n)$ having a set S of at least one element is implemented, in which each element has several of the variables such that the function is invariant under the permutation of the several variables in each element, the method comprising determining the set S, designing a symmetric logic means for filtering redundant values of the variables of each element, the redundant values being "don't cares", designing a combinational logic means as a function of the "don't cares", and constructing a logic circuit having the symmetric logic means and the combinational logic means being connected together to implement the function.

BRIEF DESCRIPTION OF THE DRAWINGS

FIG. 1 is a Karnaugh map of a given, four-variable Boolean function used for implementing a combinational logic circuit.

FIG. 2 is a logic circuit implemented in a conventional manner using the map of FIG. 1.

FIG. 3 is a block diagram of the present invention.

FIG. 4 is a schematic illustration of a transposition gate of the present invention.

FIG. 5 is a Karnaugh map used in the present invention for implementing the four-variable function of the map of FIG. 1.

FIG. 6 illustrates the simplified, combinational logic circuit implementing the function of FIG. 1 in accordance with the present invention.

FIGS. 7A and 7B are Karnaugh maps of a given, five-variable Boolean function to be implemented.

FIGS. 8A and 8B are Karnaugh maps used to implement the function of FIGS. 7A and 7B in accordance with the present invention.

FIG. 9 is combinational logic circuit implementing the function of FIGS. 7A and 7B in accordance with the present invention.

FIG. 10 is a combinational logic circuit implementing the function of FIGS. 7A and 7B in accordance with conventional techniques.

DETAILED DESCRIPTION OF THE INVENTION

EXAMPLE 1—Prior Art

Simplification Techniques

FIG. 1 shows a conventional Karnaugh map used for implementing a Boolean function $f(x)$ of four variables $x_1-x_4$. The pairs of digital values for variables $x_1, x_2$ are shown at the top of the map and the pairs of digital values for variables $x_3, x_4$ are shown at the left of the map. In the example of FIG. 1, the single-output Boolean function $f(x)$ to be implemented is given by the number 1 in each square of the map. This Boolean function $f(x)$, in unsimplified form, can therefore be written as follows:

$$f(x) = \bar{x}_1 x_2 \bar{x}_3 \bar{x}_4 + x_1 \bar{x}_2 \bar{x}_3 \bar{x}_4 + \qquad (6)$$
$$\bar{x}_1 \bar{x}_2 \bar{x}_3 x_4 + \bar{x}_1 \bar{x}_2 x_3 \bar{x}_4 +$$
$$\bar{x}_1 x_2 x_3 \bar{x}_4 + x_1 \bar{x}_2 x_3 \bar{x}_4$$

Equation 6 is a complex function which can be minimized or simplified by conventional use of the Karnaugh map of FIG. 1. To start, adjacent squares of the map are grouped so that each group will contain the greatest possible number of 1's. Group size is limited to 1, 2, 4, 8 and 16 squares and the map can be folded on itself to group the squares. Overlapping of squares is permissible. Consequently, groups referenced A–D are shown, indicating that the simplified Boolean expression will contain four terms rather than the six terms of equation 6.

As a result of this grouping, equation 6 can be rewritten as follows, with each line (A)–(D) representing a corresponding group number shown:

$$f(x) = (A)\,\bar{x}_1 x_2 \bar{x}_3 \bar{x}_4 + \bar{x}_1 x_2 \bar{x}_3 x_4 + \qquad (7)$$
$$(B)\,\bar{x}_1 \bar{x}_2 \bar{x}_3 x_4 + \bar{x}_1 x_2 \bar{x}_3 x_4 +$$
$$(C)\,x_1 \bar{x}_2 \bar{x}_3 \bar{x}_4 + x_1 \bar{x}_2 x_3 \bar{x}_4 +$$
$$(D)\,\bar{x}_1 \bar{x}_2 x_3 \bar{x}_4 + x_1 \bar{x}_2 x_3 \bar{x}_4$$

Next, to simplify equation 7, for each vertical and horizontal grouping those variables which change in value, i.e., can be either 1 or 0, can be eliminated. For example, in vertical grouping A of equation 7 only the variable $x_4$ so changes. Accordingly, the simplified function $f(x)$ can now be written as follows:

$$f(x) = (A)\,\bar{x}_1 x_2 \bar{x}_3 + \bar{x}_1 x_2 \bar{x}_3 + \qquad (8)$$
$$(B)\,\bar{x}_1 \bar{x}_3 x_4 + \bar{x}_1 \bar{x}_3 x_4 +$$
$$(C)\,x_1 \bar{x}_2 \bar{x}_4 + x_1 \bar{x}_2 \bar{x}_4 +$$
$$(D)\,\bar{x}_2 x_3 \bar{x}_4 + \bar{x}_2 x_3 \bar{x}_4$$

From equation 8 it can be seen that the two terms of each group are identical so that in accordance with one Boolean algebra theorem, one term of each group can be eliminated. The Boolean function $f(x)$ can then be simplified as follows:

$$f(x) = \bar{x}_1 x_2 \bar{x}_3 + \bar{x}_1 \bar{x}_3 x_4 + x_1 \bar{x}_2 \bar{x}_4 + \qquad (9)$$
$$\bar{x}_2 x_3 \bar{x}_4$$

Equation 9 is the simplified function of equation 6.

The combinational logic circuit that can be implemented from equation 9 is shown in FIG. 2. By using the above standard simplification techniques, the implementation of the given Boolean function of equation 6 utilizes five logic gates including four AND gates 10, an OR gate 12, and four inverters 14. This circuit also requires sixteen inputs, each given by reference numeral 16, not counting inputs to inverters 14.

THE PRESENT INVENTION

General Principles

The present invention is based upon an analysis or decomposition of a given Boolean function f(x), such as is given by equation 6, into a symmetric part, $S\alpha$, and a combinational part, g(x). Structurally, these parts are implemented, as shown in FIG. 3, by a logic array $S\alpha$ and by a combinational logic circuit g(x).

From equation 5, it was shown that if the function f(x) includes n Boolean variables $x_1 - x_n$, then $\alpha$ is one permutation of the n Boolean variables which does not change the value of the Boolean function.

As already indicated f(x) is partially symmetric if the set $S\alpha$, i.e., the symmetric part, contains one or more $\alpha$'s, but less than all of the possible permutations of the n variables. The present invention exploits the partial symmetry of a given Boolean function to simplify the logic circuit implementing the function.

The overall design procedure of the present invention begins by determining the symmetry properties of the given Boolean function, f(x). There are several well-known techniques to accomplish this, such as is described in Logic Design of Digital Systems, by D. L. Dietmeyer, 1971, Allyn and Bacon, Boston, Mass. Using this technique, each $\alpha$ for the given function f(x) can be determined, in which each $\alpha$ is an element of the set $S\alpha$.

The next step is to design $S\alpha$, which uses some knowledge from group theory. Given any permutation of n variables, from group theory if can be shown that this permutation is the product of transpositions. A transposition is defined as a permutation of two variables $x_i x_j$ of the element of a set. For example, a four variable function f(x) where the partial symmetry is such that $x_1$ can be interchanged with $x_4$, $x_4$ can be interchanged with $x_2$, and $x_2$ can be interchanged with $x_1$, is given by (142). As a result, an example transposition is (12), which means that $x_1$ can be interchanged with $x_2$. Consequently, the permutation (142) can be written as the product of two transpositions (14) (12).

A transposition (ij) in the product decomposition of $\alpha$ indicates that variables $x_i$ and $x_j$ can be interchanged without changing the output of function f(x). This concept is illustrated in the permutation of $x_i x_j$ shown by the following truth table:

| input | | output | |
|---|---|---|---|
| $x_i$ | $x_j$ | $x_i'$ | $x_j'$ |
| 0 | 0 | 0 | 0 |
| 0 | 1 | 1 | 0 |
| 1 | 0 | 1 | 0 |
| 1 | 1 | 1 | 1 |

If, as noted above, the function f(x) is symmetric with respect to the transposition $(x_i x_j)$, the value of these two variables can be interchanged without changing the output of the function. Hence, as can be seen from the above table, the input value 0 1 is filtered from the output. In other words, the value 0 1 of the input variables $x_1 x_j$ does not appear as output values for $x_i' x_j'$. These filtered input values 0 1 are termed "don't cares" and are used in the design of g(x).

The circuit diagram, i.e., $S\alpha$, for implementing the above table is shown in FIG. 4 and is called a transposition gate 18. From the above table, it can be seen that the output $x_i'$ can be implemented by an OR gate and the output $x_j'$ can be implemented by an AND gate. Consequently, the transposition gate 18 is implemented by interconnecting an AND gate 20 and an OR gate 22 as shown, and is a two input, two output device. Thus, should the values 0 1 appear for $x_i x_j$, the output values will be 0 1.

The values 0 1 and 1 0 for $x_i x_j$ are known as minterms, and, as just described, for implementing $S\alpha$ the particular values 0 1 are "don't cares". As as alternative for implementing $S\alpha$ the values 1 0 of the minterms can be considered to be the "don't cares". In this latter case, the output $x_i'$ would be implemented by the AND gate 20 and the output $x_j'$ by the OR gate 22. Another way of considering this is that the values 1 0 or 0 1 are redundant values, depending on the implementation of $S\alpha$, and thus can be filtered by $S\alpha$. The other values of $x_i x_j$ are non-redundant.

Once $S\alpha$ has been designed and all the "don't cares" are known for the partially symmetric function f(x) being implemented, the combinational circuit g(x) can be designed. As will be shown, g(x) can now be implemented using conventional simplification techniques.

EXAMPLE 1—Simplification Techniques of the Present Invention

As a first example of the present invention, assume the Boolean function f(x) to be implemented is given by the Karnaugh mp of FIG. 1, and equation 6. This function can be implemented with the present invention in the following manner.

First, the symmetrys of the function f(x) of equation 6 are determined by known techniques. Using, for example, the techniques disclosed in the above-described Dietmeyer publication, it can be shown that this function f(x) is symmetric under the permutation $(x_1 x_3, x_2 x_4, x_3 x_1, x_4 x_2)$. This permutation can be written as the product of two transpositions (13) (24). Consequently, the transposition array $S\alpha$ will have two transposition gates 18, one of each of the two transpositions (13) and (24).

From the above truth table, the input values 1 0 for $x_1 x_3$ are don't cares" and the input values 1 0 for $x_2 x_4$ are "don't cares". In implementing the combinational logic g(x), a Karnaugh map for g(x) is generated, as shown in FIG. 5, based on the Karnaugh map of FIG. 1 for the function f(x). In generating the Karnaugh map of FIG. 5, the "don't cares" for g(x) are expressed in the map, as are the number 1's from FIG. 1. Thus, in FIG. 5, wherever the values 1 0 for $x_1 x_3$ and for $x_2 x_4$ appear, a "don't care" identified by $\phi$ is placed in the corresponding square. Note by comparing FIGS. 1 and 5 that in some instances a 1 in a square of the map of FIG. 1 is replaced by a "don't care" $\phi$ in the map of FIG. 5 is implementing g(x).

Next, since the "don't cares" $\phi$ appear in the map of FIG. 5, this means that either a number 1 or a 0 can be placed in the corresponding square and the function f(x) will not change. In accordance with standard simplification techniques, 1's are placed in certain squares of FIG. 5 for the "don't cares" $\phi$ so as to maximize the grouping of 1's. Consequently, 1's are placed in the squares as shown by the dotted lines in FIG. 5 to produce two groups referenced A and B.

From the grouping of FIG. 5, the function g(x) can be written as follows:

$$g(x) = (A) \bar{x}_1 x_2 \bar{x}_3 x_4 + \bar{x}_1 x_2 \bar{x}_3 x_4 + \quad (10)$$

-continued $$(B) \quad \begin{aligned} & x_1 x_2 \bar{x}_3 x_4 + x_1 \bar{x}_2 x_3 x_4 + \\ & \bar{x}_1 \bar{x}_2 x_3 x_4 + \bar{x}_1 x_2 x_3 \bar{x}_4 + \\ & x_1 x_2 x_3 \bar{x}_4 + x_1 \bar{x}_2 x_3 \bar{x}_4 \end{aligned}$$

By using the above-mentioned simplification techniques, equation 10 can be minimized to the following:

$$g(x) = (A) \bar{x}_3' x_4' + \qquad (11)$$
$$(B) \, x_3' \bar{x}_4'$$

By using Boolean algebra theorems, equation 11 can be simplified to:

$$g(x) = x'_3 \oplus x'_4 \qquad (12)$$

Equation 12 shows that the combinational logic $g(x)$ can be implemented by an EXCLUSIVE-OR gate.

As a result, FIG. 6 illustrates the overall logic circuit used to implement the function $f(x)$ of equation 6 with the techniques of the present invention. This circuit includes a transposition logic array $S\alpha$ having two transposition gates 18a and 18b. Gate 18a is used for filtering values 1 0 for input variables $x_1 x_3$, and gate 18b is used for filtering values 1 0 for input variables $x_2 x_4$. This circuit of FIG. 6 also includes for $g(x)$ an EXCLUSIVE-OR gate 24 connected to array 18 as specified by equation 12.

Each transposition gate 18a and 18b has an AND gate 20 and an OR gate 22 used to implement the given Boolean function $f(x)$ of equation 6. Thus, the circuit of FIG. 6 includes a total of two AND gates 20, three OR gates 22, 24, and ten inputs 16, with no inverters. This is in comparison to the implementation of FIG. 2 requiring five gates, four inverters and sixteen inputs.

EXAMPLE 2

Simplification Techniques of the Present Invention

Example 2 will be used to describe the implementation of a given, more complex function $f(x)$ in accordance with the present invention to show a greater reduction in the number of gates and inputs over Example 1 than if conventional simplification techniques were utilized. The given Boolean function $f(x)$ to be implemented is shown by the Karnaugh maps of FIG. 7A and FIG. 7B. This function $f(x)$ is a five-variable function having variables $x_1 - x_5$. FIG. 7A shows the Karnaugh map for $x_5 = 0$ and FIG. 7B shows the Karnaugh map for $x_5 = 1$. From FIG. 7A and FIG. 7B the given function $f(x)$ to be implemented is as follows:

$$\begin{aligned} f(x) = & \bar{x}_5 x_1 \bar{x}_2 \bar{x}_3 x_4 + \bar{x}_5 \bar{x}_1 x_2 x_3 x_4 + \\ & \bar{x}_5 \bar{x}_1 \bar{x}_2 x_3 x_4 + \bar{x}_5 x_1 x_2 x_3 \bar{x}_4 + \\ & \bar{x}_5 x_1 \bar{x}_2 x_3 \bar{x}_4 + x_5 \bar{x}_1 \bar{x}_2 \bar{x}_3 \bar{x}_4 + \\ & x_5 \bar{x}_1 x_2 \bar{x}_3 \bar{x}_4 + x_5 x_1 \bar{x}_2 \bar{x}_3 \bar{x}_4 + \\ & x_5 \bar{x}_1 \bar{x}_2 x_3 \bar{x}_4 + x_5 x_1 \bar{x}_2 x_3 \bar{x}_4 + \\ & x_5 \bar{x}_1 x_2 x_3 \bar{x}_4 + x_5 x_1 \bar{x}_2 x_3 \bar{x}_4 + \\ & x_5 x_1 x_2 x_3 \bar{x}_4 \end{aligned} \qquad (13)$$

Using the above-mentioned techniques disclosed in the Dietmeyer publication, equation 13 can be determined to be symmetric with respect to the permutation (12) (35). As before, this permutation indicates that the transposition array $S\alpha$ or 18 will have two transposition gates for the respective transpositions (12) and (35), and that the values 1 0 for $x_1 x_2$ and $x_3 x_5$ are "don't cares". These "don't cares" are then expressed in generating the Karnaugh map for $g(x)$, which is shown in FIG. 8A and FIG. 8B. In FIG. 8A only "don't cares" $\phi$ are expressed so that these need not be considered in designing $g(x)$. In comparing FIG. 7A and FIG. 8A, note that all the squares having a number 1 have been replaced by "don't cares" $\phi$.

In FIG. 8B both 1's and "don't cares" $\phi$ appear in the squares. The function $g(x)$ is now simplified using conventional techniques by assigning 1's to the "don't cares" $\phi$ to produce the largest grouping of squares. Consequently, only one square is changed from a don't care" $\phi$ to a 1 shown in parenthesis, resulting in four groupings A–D.

From the groupings of FIG. 8B, the function $g(x)$ can now be written as follows:

$$\begin{aligned} g(x) = & (A) \, x_5 \bar{x}_1 \bar{x}_2 \bar{x}_3 \bar{x}_4 + x_5 \bar{x}_1 x_2 \bar{x}_3 \bar{x}_4 + \\ & (B) \, x_5 \bar{x}_1 \bar{x}_2 \bar{x}_3 \bar{x}_4 + x_5 \bar{x}_1 \bar{x}_2 x_3 \bar{x}_4 + \\ & (C) \, x_5 \bar{x}_1 \bar{x}_2 x_3 x_4 + x_5 \bar{x}_1 x_2 x_3 x_4 + \\ & (D) \, x_5 x_1 x_2 x_3 \bar{x}_4 + x_5 \bar{x}_1 x_2 x_3 \bar{x}_4 \end{aligned} \qquad (14)$$

Again using standard techniques, equation 14 can be simplified as follows:

$$\begin{aligned} g(x) = & x_5' \bar{x}_1' \bar{x}_3' \bar{x}_4 + x_5' \bar{x}_1' \bar{x}_2' \bar{x}_3' + \\ & x_5' \bar{x}_1' x_3' x_4 + x_5' x_1' x_3' \bar{x}_4 \end{aligned} \qquad (15)$$

As a result, the function $f(x)$ can be implemented, as shown in FIG. 9, using two transposition gates 18a and 18b, four AND gates 26, one OR gate 28, four inverters 30, and twenty eight inputs 32, not counting inputs to inverters 30.

On the other hand, it can be shown, using the above-described conventional minimization techniques, that the function $f(x)$ of equation 13 would be implemented as shown in FIG. 10. This circuit requires ten AND gates 34, three Or gates 35, forty nine inputs 36, and seven inverters 38, not counting inputs to inverters 38.

Thus, depending on the particular function $f(x)$ being implemented, significant reductions in numbers of circuit components and inputs can be achieved over conventional simplification techniques by taking advantage of the symmetries of a partially symmetric function. The fewer number of components and inputs the quicker data processing time that can be achieved.

Also, greater circuit reliability can be achieved with the present invention for the following reason. Since each transposition gate 18, e.g. gate 18a and gate 18b, is identical, this makes it easier to design or plan integrated circuits in a more orderly fashion. Generally, a more orderly designed circuit is easier to manufacture and this results in greater reliability.

In addition, overall circuit reliability is related to the number of components and interconnections in a circuit. Since designing a circuit with a transposition gate reduces both the number of components and the number of interconnections as compared to a circuit designed using prior techniques, the circuit having a transposition gate will be more reliable in its operation.

Furthermore, as already clearly described, the present invention exploits the symmetries of the function f(x). In other words, the natural "don't cares" of the function f(x) are found and used to simplify the circuit. The significance of this is that the present invention can be used to process the output variables of any other logic circuit as its inputs for Sα and g(x).

I claim:

1. A logic circuit for implementing a given, partially symmetric Boolean function $f(x_1-x_n)$ having one output and which is symmetric with respect to several variables of the input variables $x_1-x_n$ such that the function is invariant under the permutation of the several variables, comprising:
   (a) symmetric logic means for filtering only redundant values of the several variables, the redundant values being "don't cares"; and
   (b) combinational logic means, connected to said symmetric logic means, for generating the one output and having a construction as a function of the "don't cares".

2. A logic circuit according to claim 1 wherein said symmetric logic means comprises transposition logic gate means, having two inputs and two outputs, for gating a pair of variables of the several variables.

3. A logic circuit according to claim 2 wherein the pair of variables has two minterms and wherein said transposition logic gate means comprises an AND gate and an OR gate being connected to filter one of the minterms.

4. A logic circuit for implementing a given, partially symmetric, Boolean function $f(x_1-x_n)$ having one output and which is pairwise symmetric with respect to at least one pair $x_ix_j$ of input variables $x_1-x_n$ such that the function $f(x_1-x_n)$ is invariant under the permutation of $x_ix_j$, comprising:
   (a) symmetric logic array means, responsive to each said pair $x_ix_j$ of input variables $x_1-x_n$, for filtering redundant values of said pair $x_ix_j$, the redundant values being "don't cares"; and
   (b) combinational logic gate means, connected to said symmetric logic array means, for generating the output and being constructed as a function of the "don't cares".

5. A logic circuit according to claim 4 wherein said symmetric logic array means comprises a transposition logic gate for each said pair $x_ix_j$.

6. A logic circuit according to claim 5 wherein each said pair $x_ix_j$ has two minterms 1 0 and 0 1, and each said transposition logic gate includes an AND gate and an OR gate being connected to filter one of the minterms.

7. A method of implementing a given partially symmetric Boolean function $f(x_1-x_n)$ having a set S of at least one element, in which each element has several of the variables $x_1-x_n$ such that the function $f(x_1-x_n)$ is invariant under the permutation of the several variables in each element, comprising:
   (a) determining the set S;
   (b) designing a symmetric logic means for filtering redundant values of the variables of each element, the redundant values being "don't cares",
   (c) designing a combinational logic means as a function of the "don't cares"; and
   (d) constructing a logic circuit having the symmetric logic means and the combinational logic means being connected together to implement the function $f(x_1-x_n)$.

8. A method according to claim 7 wherein the step of designing the combinational logic means comprises using the "don't cares" to simplify the combinational logic means.

* * * * *